US009397127B2

(12) United States Patent
Hong

(10) Patent No.: US 9,397,127 B2
(45) Date of Patent: Jul. 19, 2016

(54) THIN FILM TRANSISTOR ARRAY PANEL AND METHOD OF MANUFACTURING THE SAME

(71) Applicant: Samsung Display Co., Ltd., Yongin, Gyeonggi-Do (KR)

(72) Inventor: Sun-Young Hong, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/994,975

(22) Filed: Jan. 13, 2016

(65) Prior Publication Data

US 2016/0133657 A1 May 12, 2016

Related U.S. Application Data

(62) Division of application No. 14/265,774, filed on Apr. 30, 2014, now Pat. No. 9,252,160.

(30) Foreign Application Priority Data

Dec. 16, 2013 (KR) ........................ 10-2013-0156543

(51) Int. Cl.
*H01L 21/00* (2006.01)
*H01L 29/66* (2006.01)
*H01L 27/12* (2006.01)

(52) U.S. Cl.
CPC .......... *H01L 27/1288* (2013.01); *H01L 27/124* (2013.01); *H01L 27/1222* (2013.01); *H01L 27/1248* (2013.01)

(58) Field of Classification Search
CPC ................................................ H01L 27/1248
USPC ........... 257/270, 260, 626; 438/158, 195, 282
See application file for complete search history.

(56) References Cited

U.S. PATENT DOCUMENTS

| 6,001,539 | A | 12/1999 | Lyu et al. |
| 7,649,581 | B2 | 1/2010 | Choi et al. |
| 7,692,188 | B2 * | 4/2010 | Cho .................... H01L 51/0545 257/40 |
| 9,252,160 | B2 * | 2/2016 | Hong ................ H01L 29/66969 257/270 |
| 2011/0291096 | A1 | 12/2011 | Ryoo et al. |
| 2013/0130421 | A1 | 5/2013 | Choi et al. |

FOREIGN PATENT DOCUMENTS

| JP | 4034376 B2 | 11/2007 |
| JP | 2010-219094 A | 9/2010 |
| KR | 1020060004718 A | 1/2006 |
| KR | 1020100064268 A | 6/2010 |
| KR | 1020110051973 A | 5/2011 |
| KR | 1020110066808 A | 6/2011 |
| KR | 1020120102338 A | 9/2012 |

* cited by examiner

*Primary Examiner* — Calvin Lee
(74) *Attorney, Agent, or Firm* — Innovation Counsel LLP

(57) ABSTRACT

An exemplary embodiment provides a thin film transistor array panel including: a substrate; a gate line; a semiconductor layer; a data wire layer; a first passivation layer; and a second passivation layer. The gate line is disposed on the substrate and includes a gate electrode. The semiconductor layer is disposed on the substrate. The data wire layer is configured to include a data line disposed on the substrate to cross the gate line, a source electrode connected to the data line, and a drain electrode disposed to face the source electrode. The first passivation layer is disposed on a channel region between the source electrode and the drain electrode. The second passivation layer is disposed on the first passivation layer, the source electrode, and the drain electrode. A width of the first passivation layer disposed on the channel region is equal to or smaller than a distance between the source electrode and the drain electrode.

10 Claims, 12 Drawing Sheets

THIN FILM TRANSISTOR ARRAY PANEL AND METHOD OF MANUFACTURING THE SAME

CROSS-REFERENCE TO RELATED APPLICATIONS

This application is a divisional application which claims priority to and the benefit of U.S. patent application Ser. No. 14/265,774, filed on Apr. 30, 2014, now U.S. Pat. No. 9,252,160 issued Feb. 2, 2016, which claims priority to and the benefit of Korean Patent Application No. 10-2013-0156543 filed in the Korean Intellectual Property Office on Dec. 16, 2013, the entire contents of which are incorporated herein by reference.

BACKGROUND (a) Field

The present application relates to a thin film transistor array panel and a manufacturing method thereof.

(b) Description of the Related Art

Displays such as a liquid crystal display (LCD), an organic light emitting diode (OLED) display, an electrophoretic display, a plasma display, and the like include multiple pairs of electric field generating electrodes and an electro-optical active layer interposed therebetween. The liquid crystal display includes a liquid crystal layer as the electro-optical active layer, and the organic light emitting display includes an organic light emitting layer as the electro-optical active layer. Either one of a pair of electric field generating electrodes is generally connected to a switching element to receive an electrical signal, and the electro-optical active layer converts the electrical signal into an optical signal to display an image.

The flat panel display may include a display panel having a thin film transistor. The thin film transistor array panel is patterned with multiple electrodes and semiconductors, and masks are generally used in the patterning process.

The semiconductor is an important factor in determining the characteristics of the thin film transistor. The semiconductor is generally made of amorphous silicon, however the charge mobility thereof is low such that there is a limit in manufacturing a high performance thin film transistor. Further, when using polysilicon, the charge mobility is high such that manufacturing of the high performance thin film transistor is easy, however the cost is high and uniformity is low such that there is a limit in manufacturing a large-sized thin film transistor array panel.

Accordingly, a thin film transistor using an oxide semiconductor having high charge mobility and a high ON/OFF ratio of current compared with amorphous silicon and having a low cost and high uniformity compared with polysilicon has been researched.

A plasma pre-treatment is performed to stabilize a channel layer containing an oxide semiconductor. In this case, the channel layer is contaminated by reacting with a wiring material exposed to a surface thereof, thereby deteriorating a thin film transistor characteristic.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a thin film transistor array panel and a manufacturing method thereof, which stabilizes a thin film transistor characteristic.

An exemplary embodiment provides a thin film transistor array panel including: a substrate; a gate line; a semiconductor layer; a data wire layer; a first passivation layer; and a second passivation layer. The gate line is provided on the substrate and includes a gate electrode. The semiconductor layer is provided on the substrate. The data wire layer is configured to include a data line provided on the substrate to cross the gate line, a source electrode connected to the data line, and a drain electrode provided to face the source electrode. The first passivation layer is provided on a channel region between the source electrode and the drain electrode. The second passivation layer is provided on the first passivation layer, the source electrode, and the drain electrode. A width of the first passivation layer disposed on the channel region is equal to or smaller than a distance between the source electrode and the drain electrode.

The substrate may include a first region corresponding to the first passivation layer disposed on the channel region, a second region corresponding to the data wire layer, and a third region corresponding to a remaining portion other than the first region and the second region, and the first passivation layer may be provided on the first region and the third region.

Dual films of the first passivation layer and the second passivation layer may be provided at the first region and the third region, and a single film of the second passivation layer may be provided at the second region.

The data wire layer may include a main wiring layer containing copper, and the main wiring layer may come into contact with the second passivation layer.

The thin film transistor array panel may further include a pixel electrode provided on the second passivation layer, a contact hole may be formed in the second passivation layer, and the pixel electrode and the drain electrode may be electrically connected to each other through the contact hole.

The semiconductor layer may include an oxide semiconductor, and the first passivation layer may be made of an insulating material including an oxide.

The semiconductor layer may include an amorphous semiconductor, and the first passivation layer may be made of an insulating material including an oxide or an insulating material including a nitride.

The semiconductor layer and the first passivation layer disposed on the third region may be separated from each other.

A portion between the semiconductor layer and the first passivation layer disposed on the third region that may be separated from each other is covered with the data wire layer.

The first passivation layer may be formed on the channel region to have an island shape.

An exemplary embodiment provides a manufacturing method of a thin film transistor array panel, as follows. A gate line including a gate electrode is formed on a substrate. A gate insulating layer is formed on the gate line. A semiconductor material layer and a data wire material layer are formed on the gate insulating layer. A first photosensitive film pattern is formed on the data wire material layer. The first photosensitive film pattern includes a first region and a second region having a thickness which is thicker than that of the first region. The data wire material layer and the semiconductor material layer are etched by using the first photosensitive film pattern as a mask. A second photosensitive film pattern is formed by etching back the first photosensitive film pattern. A data wire layer is formed including a source electrode, a drain electrode, and a data line on the semiconductor material layer by using the second photosensitive film pattern as a mask. A first passivation layer is formed on the second photosensitive film pattern and a channel region between the source electrode and the drain electrode. The first passivation layer disposed on the second photosensitive film pattern is removed by lifting off the second photosensitive film pattern.

The data wire layer may be internally recessed in a horizontal direction from a lower end of the second photosensitive film pattern.

The manufacturing method may further include performing a plasma pre-treatment including oxygen, before the forming of the first passivation layer.

The performing of the plasma pre-treatment including oxygen may be performed in a state in which the second photosensitive film pattern covers the data wire layer.

In the forming of the first passivation layer, the first passivation layer may be formed in a remaining portion other than a portion at which the channel region and the data wire layer are disposed.

The manufacturing method may further include forming a second passivation layer on the first passivation layer, the source electrode, and the drain electrode, after lifting off the second photosensitive film pattern.

The manufacturing method may further include forming a pixel electrode on the second passivation layer, a contact hole may be formed in the second passivation layer, and the pixel electrode and the drain electrode may be electrically connected to each other through the contact hole.

The data wire layer may be formed to include a main wiring layer containing copper, and the main wiring layer may be formed to come into contact with the second passivation layer.

The semiconductor material layer may be formed of an oxide semiconductor, and the first passivation layer may be made of an insulating material including an oxide.

The semiconductor material layer may include an amorphous semiconductor, and the first passivation layer may be made of an insulating material including an oxide or an insulating material including a nitride.

In accordance with the exemplary embodiments, a wiring material is internally provided in a low end of a photomask in a plasma pre-treatment for stabilizing a channel layer including an oxide semiconductor. Accordingly, it is possible to prevent a metal oxide from being generated and a channel layer from being contaminated to stabilize a characteristic of a thin film transistor.

DETAILED DESCRIPTION OF THE EMBODIMENTS

Figure 1:
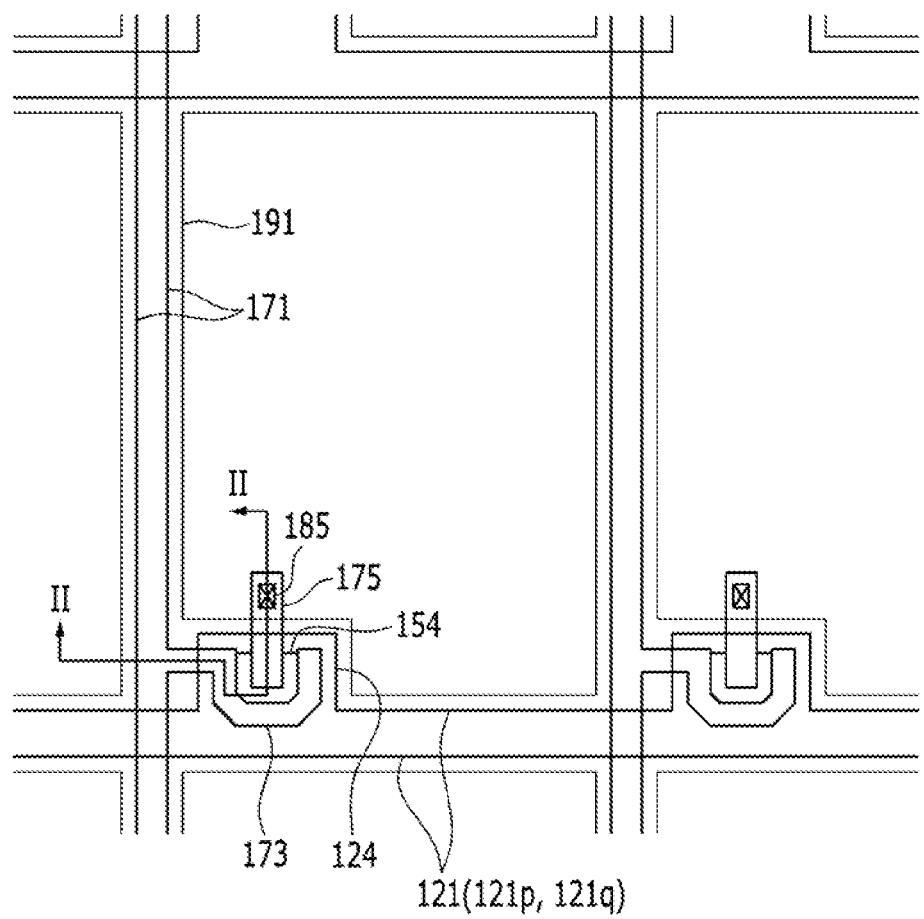
FIG. 1 is a layout view showing a thin film transistor array panel in accordance with an exemplary embodiment.

Hereinafter, exemplary embodiments will be described in detail with reference to the accompanying drawings. As those skilled in the art would realize, the described embodiments may be modified in various different ways, all without departing from the spirit or scope of the inventive concept. On the contrary, exemplary embodiments introduced herein are provided to make disclosed contents thorough and complete, and sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening elements may also be present. Like reference numerals designate like elements throughout the specification.

Figure 2:
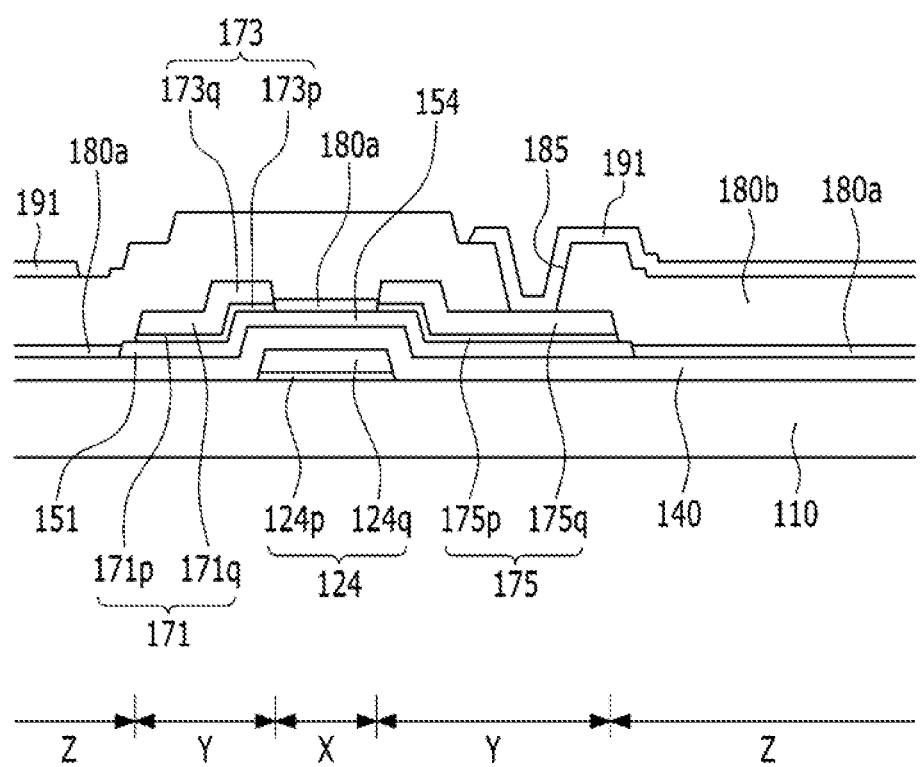
FIG. 2 is a cross-sectional view taken along a line II-II of FIG. 1.

FIG. 1 is a layout view showing a thin film transistor array panel in accordance with an exemplary embodiment. FIG. 2 is a cross-sectional view taken along a line II-II of FIG. 1. FIG. 1 shows one pixel, and such a pixel structure is repeatedly disposed in a vertical direction and a horizontal direction.

Referring to FIG. 1 and FIG. 2, a plurality of gate lines 121 are formed on a substrate 110 made of transparent glass or plastic.

The gate lines 121 serve to transfer gate signals and mainly extend in a horizontal direction. Each gate line 121 includes a plurality of gate electrodes 124 protruded therefrom.

The gate line 121 and the gate electrode 124 may be made of a dual-film structure including first layers 121$p$ and 124$p$ and second layers 121$q$ and 124$q$.

Each of the first layers 121$p$ and 124$p$ and the second layers 121$q$ and 124$q$ may be made of an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chrome (Cr), titanium (Ti), tantalum (Ta), manganese (Mn), or the like.

Alternatively, the first layers 121$p$ and 124$p$ and the second layers 121$q$ and 124$q$ may be formed by combinations of films having different physical properties. In the exemplary embodiment, the gate line 121 and the gate electrode 124 are formed as dual films, but are not limited thereto, and may be formed as a single-film or triple-film pattern.

A gate insulating layer 140 made of an insulating material such as a silicon oxide or a silicon nitride is positioned on the gate line 121.

A plurality of semiconductor layers 151 are formed on the gate insulating layer 140. The semiconductor layers 151 are extended primarily in a vertical direction at portions thereof that are overlapped with the data lines 171, and include a plurality of projections 154 that protrude toward the gate electrode 124.

The semiconductor layer 151 may be an oxide containing at least one of zinc (Zn), indium (In), tin (Sn), gallium (Ga), and hafnium (Hf). However, the semiconductor layer is not limited to the oxide semiconductor, and may contain amorphous silicon or crystalline silicon.

A data wire layer (171, 173, and 175) including a plurality of data lines 171, a plurality of source electrodes 173 connected to the data lines 171, and a plurality of drain electrodes 175 is formed on the semiconductor layer 151.

The data lines 171 serve to transfer data signals and are extended primarily in the vertical direction to cross the gate lines 121. The data lines 171 are connected to the source electrodes having a U-shape at the portion at which the gate electrode 124 is disposed.

The drain electrode 175 is separated from the data line 171 and extends upward from the center of the U shape of the source electrode 173. The shapes of the source electrode 173 and drain electrode 175 shown in FIG. 1 and FIG. 2 are merely examples, and may be changed.

The data wire layer (171, 173, and 175) have a dual-film structure of barrier layers 171*p*, 173*p*, and 175*p* and main wiring layers 171*q*, 173*q*, and 175*q*. The barrier layers 171*p*, 173*p*, and 175*p* are formed of a copper alloy, and the main wiring layers 171*q*, 173*q*, and 175*q* are formed of a low-resistance material such as copper.

Unlike the present exemplary embodiment, the data wire layer (171, 173, and 175) may have a triple-film structure of the barrier layers 171*p*, 173*p*, and 175*p*, the main wiring layers 171*q*, 173*q*, and 175*q*, and a capping layer (not shown) formed of, e.g., molybdenum, titanium, or zinc oxide on the main wiring layers 171*q*, 173*q*, and 175*q*.

The barrier layers 171*p*, 173*p*, and 175*p* may made of vanadium (V), zirconium (Zr), tantalum (Ta), manganese (Mn), magnesium (Mg), chromium (Cr), molybdenum (Mo), cobalt (Co), niobium (Nb), or nickel (Ni), or an alloy of at least one of them and copper.

The projection 154 of the semiconductor layer 151 includes an exposed portion which is not covered by the data line 171 and the drain electrode 175 between the source electrode 173 and the drain electrode 175. The semiconductor layer 151 may have substantially the same plane pattern as the data line 171 and the drain electrode 175 except for the exposed portion of the projection 154.

One gate electrode 124, one source electrode 173, and one drain electrode 175 constitute one thin film transistor (TFT) together with the projection 154 of the semiconductor layer 151, and a channel region of the thin film transistor is formed on the projection 154 between the source electrode 173 and the drain electrode 175.

A first passivation layer 180*a* is formed on an exposed portion of the projection 154 of the semiconductor layer which is not covered by the source electrode 173 and the drain electrode 175 between the source electrode 173 and the drain electrode 175. The channel region includes the exposed portion of the projection 154 of the semiconductor layer which is not covered by the source electrode 173 and the drain electrode 175. Therefore, the first passivation layer 180*a* can be thought to be provided on the channel region.

The first passivation layer 180*a* may be made of an inorganic insulator such as an insulating material including an oxide, an insulating material including a nitride, or an insulating material including an oxynitride. In the case that the semiconductor layer 151 is formed of an oxide semiconductor, the first passivation layer 180*a* is preferably made of the insulating material including an oxide. In the present exemplary embodiment, a silicon oxide or an aluminum oxide may be employed as the insulating material including an oxide.

In the present exemplary embodiment, the first passivation layer 180*a* may be formed on the channel region to have an island shape. In this case, a width of the first passivation layer 180*a* disposed on the channel region may be substantially equal to or smaller than a distance between the source electrode 173 and the drain electrode 175 as shown in FIG. 2. Further, a height of the first passivation layer 180*a* may be smaller than that of the source electrode 173 or the drain electrode 175.

In the present exemplary embodiment, the substrate 110 includes a first region X corresponding to the first passivation layer 180*a* disposed in the channel region or the exposed portion of the projection 154 of the semiconductor layer which is not covered by the source electrode 173 and the drain electrode 175, a second region Y corresponding to the data wire layers 171, 173, and 175, and a third region Z corresponding to a remaining portion other than the first region X and the second region Y.

The first passivation layer 180*a* may be provided in the third region Z as well as the first region X. As described above, the first passivation layer 180*a* in the first region X is formed in the island shape, and thus may be separated from the first passivation layer 180*a* provided in the third region Z.

Since the data wire layer (171, 173, and 175) is not formed at the third region Z, the first passivation layer 180*a* may be directly formed on the gate insulating layer 140. As shown in FIG. 2, the first passivation layer 180*a* disposed at the third region Z may come into contact with the semiconductor layer 151. However, in another exemplary embodiment, the first passivation layer 180*a* disposed at the third region Z and the semiconductor layer 151 adjacent thereto may be separately disposed.

A second passivation layer 180*b* may be provided on the first passivation layer 180*a*, the source electrode 173, and the drain electrode 175. Substantially the entire area of the substrate 110 may be covered with the second passivation layer 180*b* except for a portion where a contact hole 185 is formed.

Like the first passivation layer 180*a*, the second passivation layer 180*b* may be made of an inorganic insulator such as an insulating material including an oxide, an insulating material including a nitride, or an insulating material including an oxynitride.

In the present exemplary embodiment, dual films of the first passivation layer 180*a* and the second passivation layer 180*b* may be provided at the first region X and the third region Z of the substrate 110, and a single film of the second passivation layer 180*b* may be provided at the second region Y. The second passivation layer 180*b* may be come into contact with the main wiring layers 171*q*, 173*q*, and 175*q*.

A plurality of contact holes 185 are formed in the second passivation layer 180*b* to extend to and expose an end of the drain electrode 175.

A plurality of pixel electrodes 191 are provided on the second passivation layer 180*b*. Each pixel electrode 191 is physically and electrically connected to the drain electrode 175 through the contact hole 185, and receives a data voltage from the drain electrode 175.

In the case that the thin film transistor array panel of the present exemplary embodiment is applied to the liquid crystal display, the pixel electrodes 191 to which a data voltage is applied and a common electrode (not shown, and formed on the thin film transistor array panel) which receives a common voltage generate an electric field, thereby determining an orientation of liquid crystal molecules of a liquid crystal layer (not shown) between the two electrodes. As the pixel electrodes 191 and the common electrode form a capacitor (hereinafter referred to as a "liquid crystal capacitor"), an applied voltage is sustained even after a thin film transistor is turned off.

The pixel electrode 191 may overlap with a storage electrode line (not illustrated) to form a storage capacitor, and a voltage storage ability of the liquid crystal capacitor may be increased therethrough.

The pixel electrode 191 may be made of a transparent conductor such as ITO or IZO.

Hereinafter, a manufacturing method of the aforementioned thin film transistor array panel will be described with reference to FIG. 3 to FIG. 10. The following exemplary embodiment may be modified into other methods as an exemplary embodiment of the manufacturing method.

FIG. 3 to FIG. 11 are stepwise cross-sectional views showing the manufacturing method of the thin film transistor array panel in accordance with the exemplary embodiment. FIG. 3 to FIG. 11 sequentially show cross-sectional views taken along a line II-II.

Figure 3:
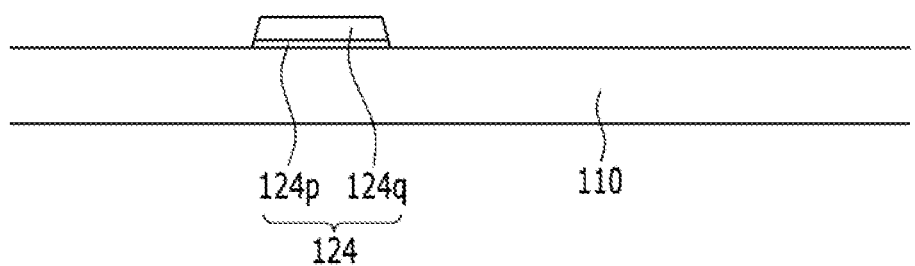
FIG. 3, 4, 5, 6, 7, 8, 9, 10, 11 are stepwise cross-sectional views showing a manufacturing method of a thin film transistor array panel in accordance with an exemplary embodiment.

Referring to FIG. 3, the gate wiring metal layer described in FIGS. 1 and 2 is stacked on a substrate 110 made of transparent glass or plastic by using a sputtering method or the like, and then patterned so as to form a gate line 121 and a gate electrode 124.

Figure 4:
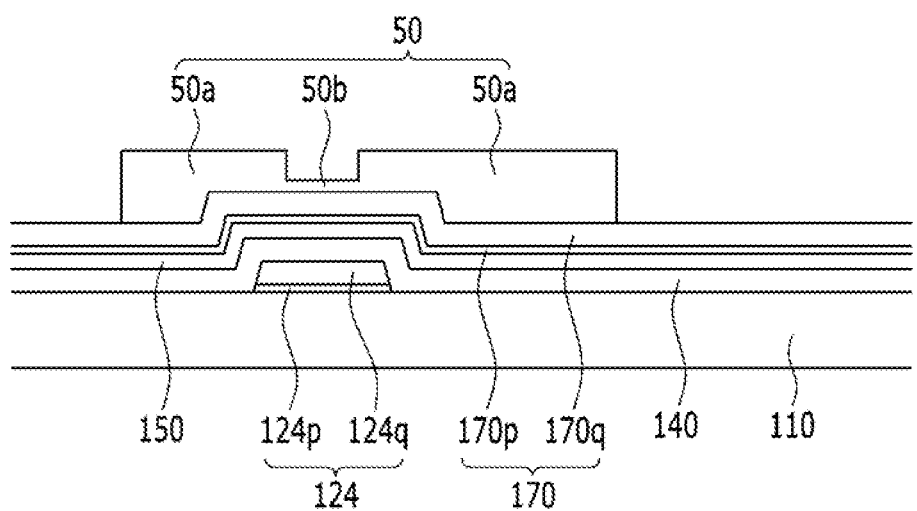

Referring to FIG. 4, a gate insulating layer 140, a semiconductor material layer 150, and a data wire material layer 170 including a barrier material layer 170p and a main wiring material layer 170q are stacked on the gate electrode 124.

The semiconductor material layer 150 may be made of a material including at least one of zinc (Zn), indium (In), tin (Sn), gallium (Ga), and hafnium (Hf). The first metal layer 170p may be made of an alloy of at least one of vanadium (V), zirconium (Zr), tantalum (Ta), manganese (Mn), magnesium (Mg), chromium (Cr), molybdenum (Mo), cobalt (Co), niobium (Nb), and nickel (Ni), and copper (Cu). The main wiring material layer 170q may be made of a low-resistance material such as copper.

A photoresist is formed and patterned on the main wiring material layer 170q to form a first photoresist pattern 50. The first photosensitive film pattern 50 has a thick first region 50a and a relatively thin second region 50b. A thickness difference of the first photoresist pattern 50 may be formed by controlling an amount of irradiated light by using a mask, or may be formed by using a reflow method. In the case of controlling an amount of irradiated light by using the mask, a slit pattern, a lattice pattern, or a semi-transparent layer may be formed on the mask. The second region 50b having a thin thickness corresponds to a position at which a channel region of the thin film transistor is formed.

Figure 5:
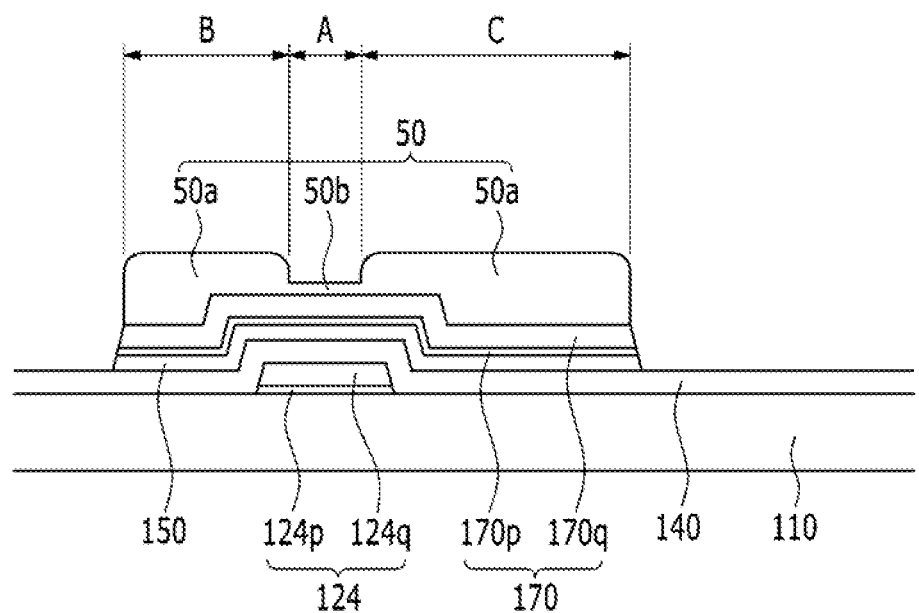

Referring to FIG. 5, the barrier material layer 170p, the main wiring material layer 170q, and the semiconductor material layer 150 are simultaneously etched by using the first photoresist pattern 50 as a mask. An etchant used in this step may be one capable of etching the barrier material layer 170p, the main wiring material layer 170q, and the semiconductor material layer 150 at the same time.

Figure 6:
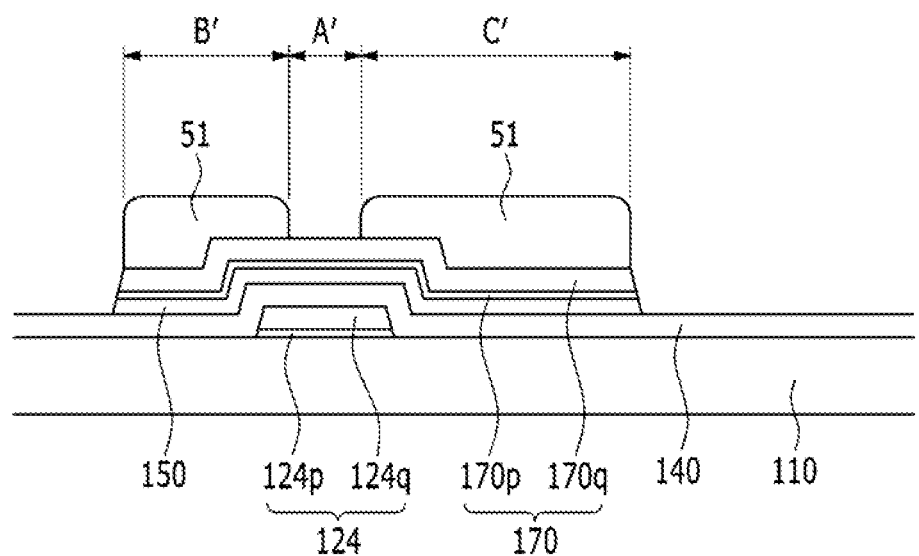

Referring to FIG. 6, the second region 50b of the first photoresist pattern 50 is removed by using an etch-back method. In this case, the first region 50a is also etched and a width and a height thereof are decreased to form a second photoresist pattern 51. The second photoresist pattern 51 is formed at regions B', and C' that are smaller than the regions B, and C with the first photoresist pattern 50 shown in FIG. 5.

Figure 7:
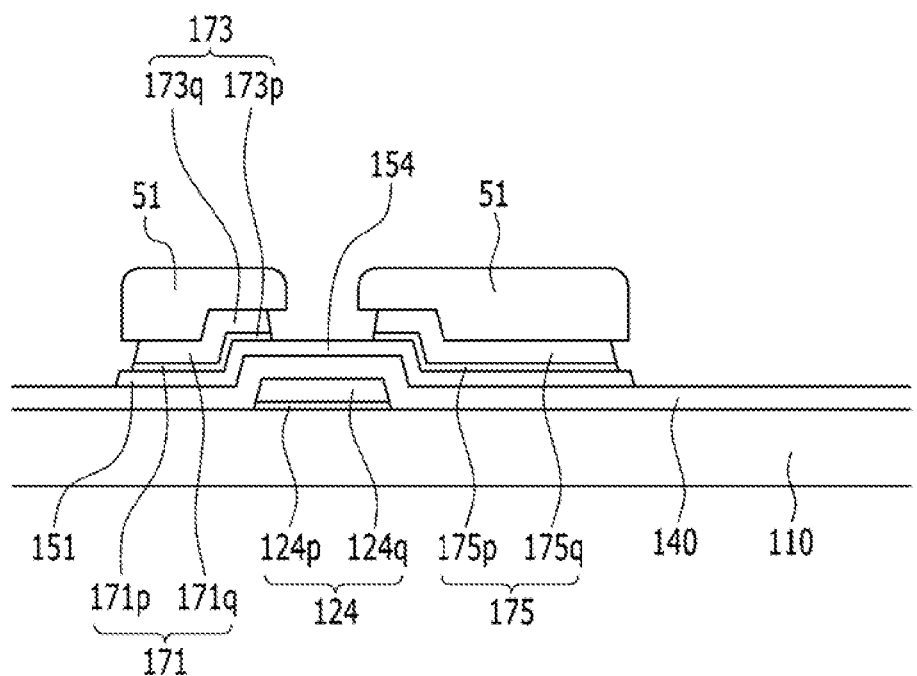

Referring to FIG. 7, the barrier material layer 170p and the main wiring material layer 170q disposed at the exposed region A' which is not covered by the second photosensitive film pattern 51 are etched by using the second photoresist pattern 51 as a mask. The etchant used in this step has to be different from the etchant used in FIG. 5. This is because the semiconductor material layer 150 of the exposed region A' which is not covered by the second photosensitive film pattern 51 is not to be etched.

In this case, a source electrode 173 and a drain electrode 175 which are separated from each other with a projection 154 of a semiconductor layer 151 being interposed therebetween are formed. The projection 154 of the semiconductor layer 151 is exposed by etching the barrier material layer 170p and the main wiring material layer 170q. A data line 171 connected to the source electrode 173 is formed at a portion thereof that is overlapped with the semiconductor layer 151. Further, while an upper surface of the semiconductor material layer 150 is exposed, the projection 154 of the semiconductor layer 151 including the channel region is formed.

As described above, by using the photoresist patterns having different thicknesses, the projection 154 of the semiconductor layer 151 has substantially the same planar pattern as that of the data wire layer (171, 173, and 175) including the data line 171, the source electrode 173, and the drain electrode 175 except the channel region.

In the present exemplary embodiment, edge boundaries of the data wire layer (171, 173, and 175) may be internally recessed from lower ends of the second photosensitive film pattern 51 along a horizontal direction. A plasma pre-treatment including oxygen may be performed in a state in which the second photosensitive film pattern 51 widely covers the data wire layer (171, 173, and 175). By performing this plasma pre-treatment including oxygen, an oxygen vacancy defect can be removed in the semiconductor layer 151 to thereby stabilize the channel region. Alternatively, in the present exemplary embodiment, a plasma pre-treatment including nitrogen oxide may be performed instead of the plasma pre-treatment including oxygen.

Figure 8:
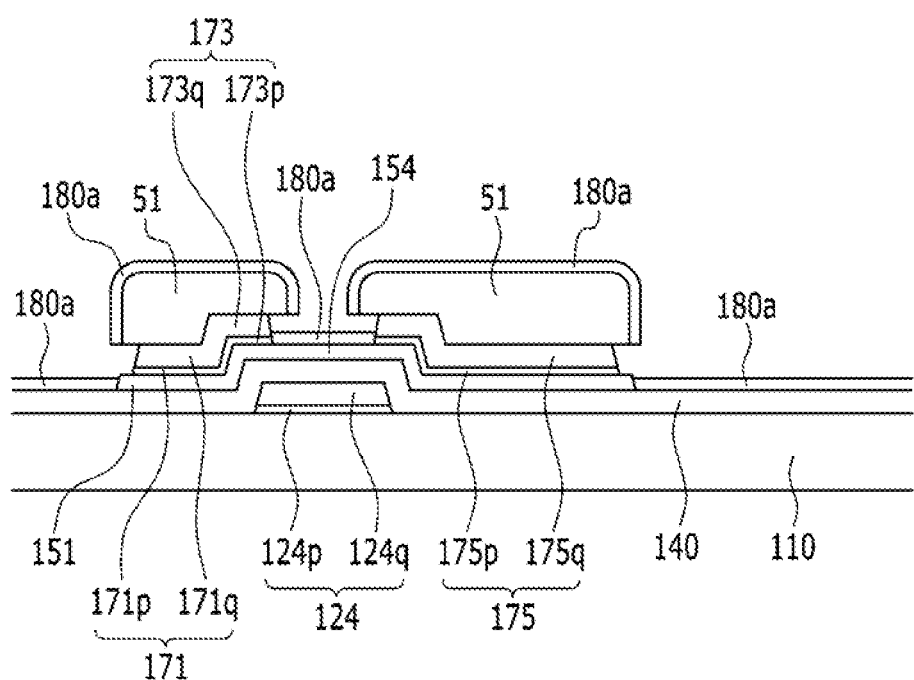

Next, referring to FIG. 8, a first passivation layer 180a is formed on the channel region between the source electrode 173 and the drain electrode 175. In this case, the first passivation layer 180a may be formed to have an island shape. Herein, the first passivation layer 180a may also be formed on the second photosensitive film pattern 51 in such a form so as to be separated from the first passivation layer 180a formed on the channel region.

Figure 9:
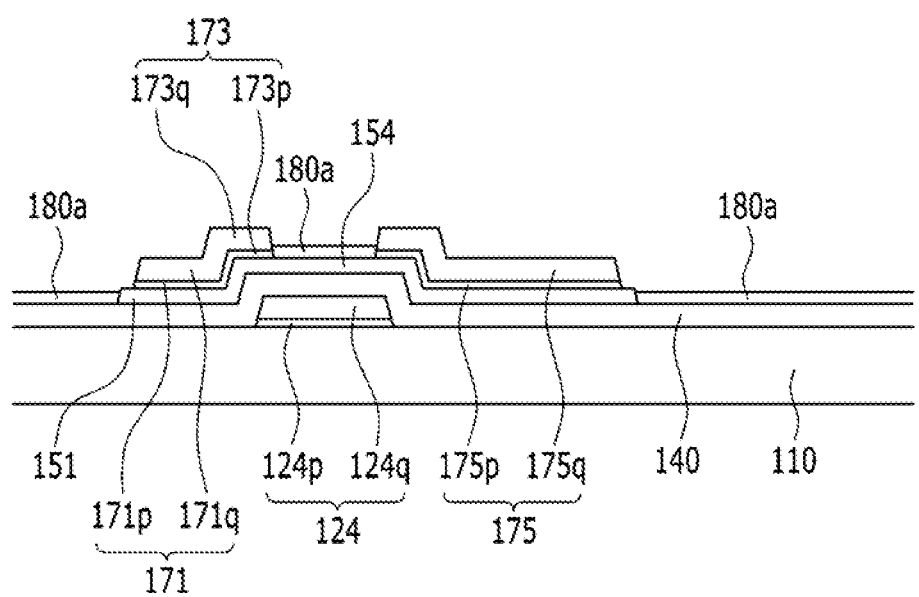

Referring to FIG. 9, the second photosensitive film pattern 51 can be removed by using a lift-off process. While lifting off the second photosensitive film pattern 51, the first passivation layer 180a formed on the second photosensitive film pattern 51 can also be removed. As a result, the first passivation layer 180a can be formed only on the region that is not covered by the channel region and the second photosensitive film pattern 51.

Figure 10:
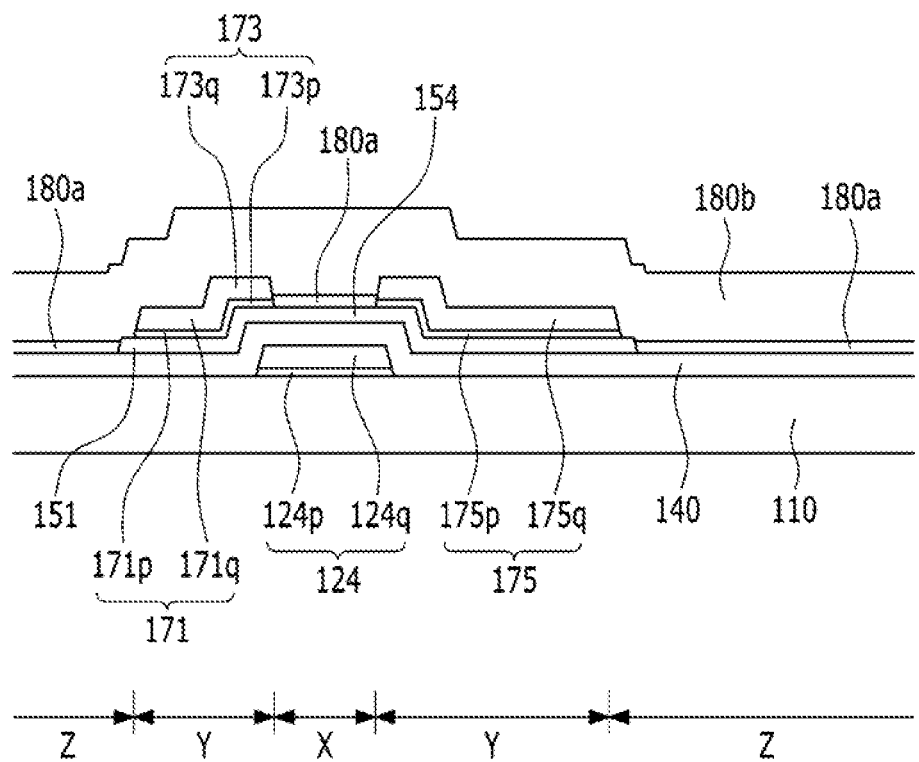

Referring to FIG. 10, a second passivation layer 180b may be formed on the first passivation layer 180a, the source electrode, 173 and the drain electrode 175. The second passivation layer 180b may be formed on an entire area of the substrate 110.

Figure 11:
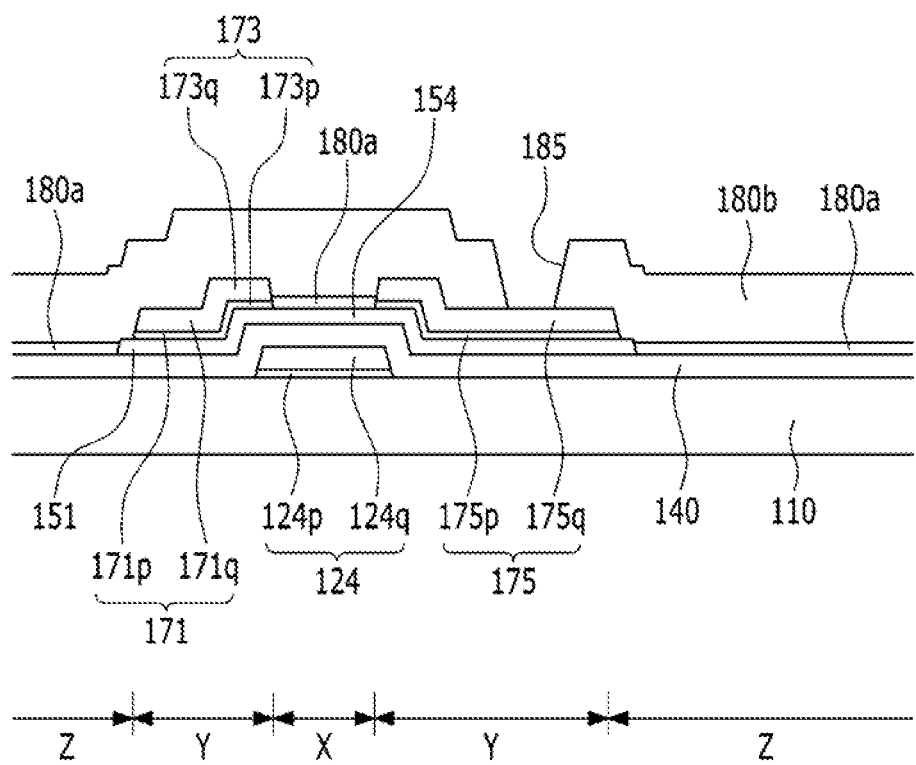

Next, referring to FIG. 11, a contact hole 185 is formed by using the photosensitive film pattern to expose the drain electrode 175 through the second passivation layer 180b. Thereafter, a heat treatment can be performed to improve a characteristic of the semiconductor layer 151.

Next, a transparent conductor such as ITO or IZO is stacked and patterned to form a pixel electrode 191 which electrically comes into contact with the exposed drain electrode 175, thereby forming a thin film transistor array panel as shown in FIG. 2.

Figure 12:
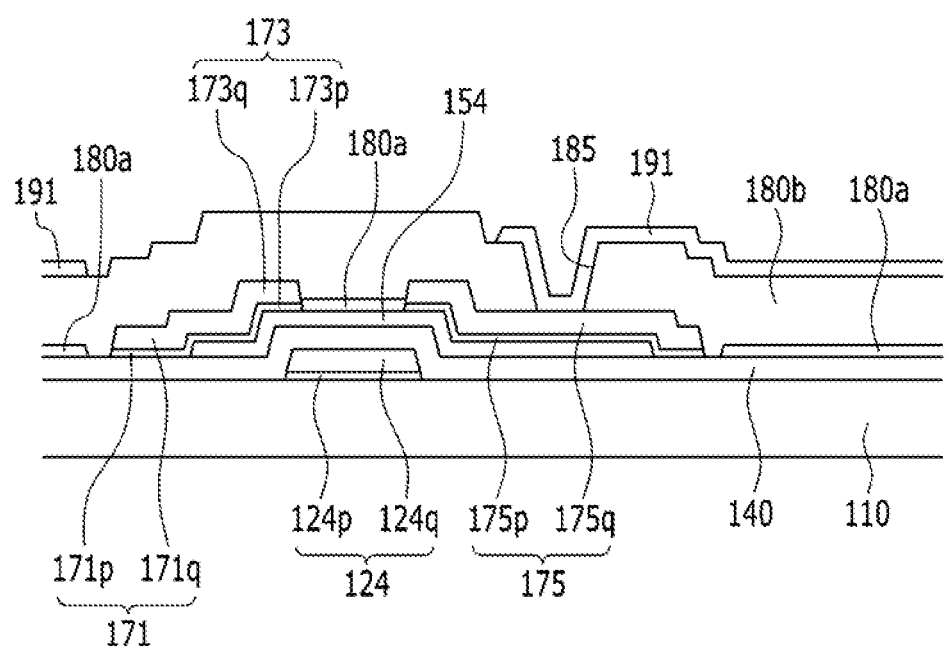
FIG. 12 is a layout view showing a thin film transistor array panel in accordance with another exemplary embodiment.

FIG. 12 is a layout view showing a thin film transistor array panel in accordance with another exemplary embodiment.

The exemplary embodiment that will be described with reference to FIG. 12 is mostly the same as the exemplary embodiment described with reference to FIG. 1 and FIG. 2. Hereinafter, the difference from the exemplary embodiment of FIG. 1 and FIG. 2 will be described.

Referring to FIG. 12, the semiconductor layer 154 may be provided at a portion corresponding to the gate electrode 124 to have an island shape, and the semiconductor layer having a linearly formed portion that is overlapped with the data line 171 may be omitted. An edge sidewall of the semiconductor layer 154 may be covered with the data line 171 or the source electrode 173, and another edge sidewall of the semiconductor layer 154 may be covered with the drain electrode 175.

In the present exemplary embodiment, the semiconductor layer 154 and the first passivation layer 180a disposed at the third region Z may be separated from each other, and such portion therebetween may be covered with the data wire layer (171, 173, and 175).

The details of the exemplary embodiment of FIG. 1 and FIG. 2 except the aforementioned difference may be applied to the present exemplary embodiment.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

| <Description of Symbols> | |
|---|---|
| 121 | gate line |
| 154 | semiconductor laver |
| 173 | source electrode |
| 180a | first passivation layer |
| 191 | pixel electrode |
| 124 | gate electrode |
| 171 | data line |
| 175 | drain electrode |
| 180b | second, passivation layer |

What is claimed is:

1. A manufacturing method of a thin film transistor array panel, the method comprising:
    forming a gate line including a gate electrode on a substrate;
    forming a gate insulating layer on the gate line;
    forming a semiconductor material layer and a data wire material layer on the gate insulating layer;
    forming a first photosensitive film pattern on the data wire material layer, the first photosensitive film pattern including a first region and a second region having a thickness which is thicker than that of the first region;
    etching the data wire material layer and the semiconductor material layer by using the first photosensitive film pattern as a mask;
    forming a second photosensitive film pattern by etching back the first photosensitive film pattern;
    forming a data wire layer including a source electrode, a drain electrode, and a data line on the semiconductor material layer by using the second photosensitive film pattern as a mask;
    forming a first passivation layer on the second photosensitive film pattern and a channel region between the source electrode and the drain electrode; and
    removing the first passivation layer disposed on the second photosensitive film pattern by lifting off the second photosensitive film pattern.

2. The manufacturing method of claim 1, wherein the data wire layer is internally recessed in a horizontal direction from a lower end of the second photosensitive film pattern.

3. The manufacturing method of claim 2, further comprising
    performing a plasma pre-treatment including oxygen, before the forming of the first passivation layer.

4. The manufacturing method of claim 3, wherein the performing of the plasma pre-treatment including oxygen is performed in a state in which the second photosensitive film pattern covers the data wire layer.

5. The manufacturing method of claim 4, wherein, in the forming of the first passivation layer, the first passivation layer is formed in a remaining portion other than a portion at which the channel region and the data wire layer are disposed.

6. The manufacturing method of claim 5, further comprising
    forming a second passivation layer on the first passivation layer, the source electrode, and the drain electrode, after lifting off the second photosensitive film pattern.

7. The manufacturing method of claim 6, further comprising
    forming a pixel electrode on the second passivation layer, wherein a contact hole is formed in the second passivation layer, and the pixel electrode and the drain electrode are electrically connected to each other through the contact hole.

8. The manufacturing method of claim 4, wherein the data wire layer is formed to include a main wiring layer containing copper, and the main wiring layer is formed to come into contact with the second passivation layer.

9. The manufacturing method of claim 8, wherein the semiconductor material layer is formed of an oxide semiconductor, and the first passivation layer is made of an insulating material including an oxide.

10. The manufacturing method of claim 8, wherein the semiconductor material layer includes an amorphous semiconductor, and the first passivation layer is made of an insulating material including an oxide or an insulating material including a nitride.

* * * * *